(12) United States Patent
Carlsen et al.

(10) Patent No.: US 7,060,417 B2
(45) Date of Patent: Jun. 13, 2006

(54) EDGE CURE PREVENTION PROCESS

(76) Inventors: Chris Carlsen, 10611 Mendell Rd. N., Stillwater Township, MN (US) 55082; David Recchia, 2166 Goodwood Blvd., Smyrna, GA (US) 30080

( * ) Notice: Subject to any disclaimer, the term of this patent is extended or adjusted under 35 U.S.C. 154(b) by 83 days.

(21) Appl. No.: 10/992,123

(22) Filed: Nov. 18, 2004

(65) Prior Publication Data
US 2006/0105271 A1 May 18, 2006

(51) Int. Cl.
*G03F 7/16* (2006.01)
*G03F 7/20* (2006.01)
*G03F 7/26* (2006.01)

(52) U.S. Cl. .................. 430/306; 430/273.1; 430/309; 430/394; 430/434; 430/494; 430/944; 101/463.1

(58) Field of Classification Search ............ 430/273.1, 430/306, 309, 394, 434, 494, 944
See application file for complete search history.

(56) References Cited

U.S. PATENT DOCUMENTS

| | | |
|---|---|---|
| 3,265,765 A | 8/1966 | Holden et al. |
| 3,867,153 A | 2/1975 | MacLachlan |
| 4,264,705 A | 4/1981 | Allen |
| 4,320,188 A | 3/1982 | Heinz et al. |
| 4,323,636 A | 4/1982 | Chen |
| 4,323,637 A | 4/1982 | Chen et al. |
| 4,369,246 A | 1/1983 | Chen et al. |
| 4,423,135 A | 12/1983 | Chen et al. |
| 4,427,759 A | 1/1984 | Gruetzmacher et al. |
| 4,622,088 A | 11/1986 | Min |
| 4,758,500 A | 7/1988 | Schober et al. |
| 4,828,641 A | 5/1989 | Werther et al. |
| 4,927,740 A | 5/1990 | Wallbillich et al. |
| 5,135,827 A | 8/1992 | Bohm et al. |
| 5,223,375 A | 6/1993 | Berrier et al. |
| 5,262,275 A | 11/1993 | Fan |
| 5,925,500 A | 7/1999 | Yang et al. |
| 6,238,837 B1 | 5/2001 | Fan |
| 6,326,124 B1 | 12/2001 | Alince et al. |
| 6,399,281 B1 | 6/2002 | Cusdin et al. |
| 2004/0067443 A1* | 4/2004 | Salvestro ..................... 430/306 |
| 2005/0235853 A1* | 10/2005 | Gotsick et al. ............. 101/465 |

FOREIGN PATENT DOCUMENTS

| | | |
|---|---|---|
| EP | 0 456 336 B1 | 6/1997 |
| EP | 0 640 878 B1 | 2/2003 |

* cited by examiner

*Primary Examiner*—Barbara L. Gilliam
(74) *Attorney, Agent, or Firm*—Carmody & Torrance LLP

(57) ABSTRACT

An automated method of preventing edge curing of cut surfaces of photosensitive printing elements is disclosed. Once a photosensitive printing element is cut in a pattern of a desired size and shape, a portion of the coversheet on a periphery of the cut edges of the printing plate is removed, while leaving intact the layer of photocurable material and the optional ablation layer beneath the coversheet. Next, an edge cure prevention composition is applied to the optional ablation layer or the layer of photocurable material revealed by the removal of the portion of the coversheet. Once the edge cure prevention composition is dried, the remainder of the coversheet may be removed from the photosensitive printing element and the printing element may be mounted on a sleeve or cylindrical carrier for further processing. The method ensures that the edge cure prevention composition is applied only to areas where it is needed and does not affect imageable areas of the printing plate.

11 Claims, No Drawings

EDGE CURE PREVENTION PROCESS

FIELD OF THE INVENTION

The present invention relates to improved methods of preventing premature curing of cut surfaces of a photosensitive relief image printing plate.

BACKGROUND OF THE INVENTION

Flexography is a method of printing that is commonly used for high-volume runs. Flexography is employed for printing on a variety of substrates such as paper, paperboard stock, corrugated board, films, foils and laminates. Newspapers and grocery bags are prominent examples. Coarse surfaces and stretch films can be economically printed only by means of flexography. Flexographic printing plates are relief plates with image elements raised above open areas. Generally, the plate is somewhat soft, and flexible enough to wrap around a printing cylinder, and durable enough to print over a million copies. Such plates offer a number of advantages to the printer, based chiefly on their durability and the ease with which they can be made.

A typical flexographic printing plate as delivered by its manufacturer is a multilayered article made of, in order, a backing, or support layer; one or more unexposed photocurable layers; a protective layer or slip film; and a cover sheet.

The backing layer lends support to the plate, and is typically a plastic film or sheet, which may be transparent or opaque.

The photocurable layer(s) can include any of the known photopolymers, monomers, initiators, reactive or non-reactive diluents, fillers, and dyes. The term "photocurable" refers to a solid composition which undergoes polymerization, cross-linking, or any other curing or hardening reaction in response to actinic radiation with the result that the unexposed portions of the material can be selectively separated and removed from the exposed (cured) portions to form a three-dimensional or relief pattern of cured material. Preferred photocurable materials include an elastomeric compound, an ethylenically unsaturated compound having at least one terminal ethylene group, and a photoinitiator. Exemplary photocurable materials are disclosed in European Patent Application Nos. 0 456 336 A2 and 0 640 878 A1 to Goss, et al., U.S. Pat. No. 5,223,375 to Berrier, et al., U.S. Pat. No. 3,867,153 to MacLahan, U.S. Pat. No. 4,264,705 to Allen, U.S. Pat. Nos. 4,323,636, 4,323,637, 4,369,246, and 4,423,135 all to Chen, et al., U.S. Pat. No. 3,265,765 to Holden, et al., U.S. Pat. No. 4,320,188 to Heinz, et al., U.S. Pat. No. 4,427,759 to Gruetzrnacher, et al., U.S. Pat. No. 4,622,088 to Min, and U.S. Pat. No. 5,135,827 to Bohm, et al., the subject matter of each of which is herein incorporated by reference in its entirety. If a second photocurable layer is used, i.e., an overcoat layer, it typically is disposed upon the first layer and is similar in composition.

The photocurable materials generally cross-link (cure) and harden in at least some actinic wavelength region. As used herein, actinic radiation is radiation capable of effecting a chemical change in an exposed moiety, and includes, for example, amplified (e.g., laser) and non-amplified light, particularly in the UV and infrared wavelength regions. Preferred actinic wavelength regions are from about 250 nm to about 450 nm, more preferably from about 300 nm to about 400 nm, even more preferably from about 320 nm to about 380 nm. One suitable source of actinic radiation is a UV lamp, although other sources are generally known to those skilled in the art.

The slip film is a thin sheet, which protects the photopolymer from dust and increases its ease of handling. In a conventional plate making process, the slip film is transparent to UV light. In this process, the printer peels the cover sheet off the printing plate blank, and places a negative on top of the slip film. The plate and negative are then subjected to flood-exposure by UV light through the negative. The areas exposed to the light cure, or harden, and the unexposed areas are removed (developed) to create the relief image on the printing plate.

In "digital" plate making processes, the slip film may be modified to include a radiation-absorbing compound so that it is ablatable by laser radiation at a selected wavelength and power. A laser that is guided by an image stored in an electronic data file is used to create an in situ negative on the digital (i.e., laser ablatable) masking layer. Portions of the laser ablatable layer are ablated by exposing the masking layer to laser radiation at the selected wavelength and power of the laser.

The laser ablatable layer can be any photoablative masking layer known in the art. Examples of such laser ablatable layers are disclosed for example, in U.S. Pat. No. 5,925,500 to Yang, et al., and U.S. Pat. Nos. 5,262,275 and 6,238,837 to Fan, the subject matter of each of which is herein incorporated by reference in its entirety. The laser ablatable layer generally comprises a radiation absorbing compound and a binder. The radiation absorbing compound is chosen to be sensitive to the wavelength of the laser and is generally selected from dark inorganic pigments, carbon black, and graphite. The binder is generally selected from polyamides, and cellulosic binders, such as hydroxypropyl cellulose. The benefit of using a laser to create the image is that the printer need not rely on the use of negatives and all their supporting equipment, and can rely instead on a scanned and stored image, which can be readily altered for different purposes, thus adding to the printer's convenience and flexibility.

After imaging, the photosensitive printing element is developed to remove the masking layer and the unpolymerized portions of the layer of photocurable material to create a relief image on the surface of the photosensitive printing element. Typical methods of development include washing with various solvents or water, often with a brush. Other possibilities for development include the use of an air knife, or heat plus a blotter.

Printing plates with laser ablatable masks can be used to form seamless, continuous imaging elements. The flat sheet elements are cut to size and wrapped around a cylindrical form, usually a printing sleeve or the printing cylinder itself, and the edges are fused together to form a seamless, continuous element prior to imaging of the laser ablatable (digital) mask by a laser. However, if care is not taken to cover the photocurable surfaces exposed by the cutting process with a material that is opaque to the UV radiation used to expose the plate, a phenomenon called "edge cure" can result.

Edge cure is caused by UV light contacting the cut edges and corners of the plate, which polymerizes the photopolymer and creates an undesirable raised border around the edges of the plate. This border must then be manually cut from the plate, which requires time and can result in damage to the plate, especially if portions of the image are near the plate edge. In addition, removal of the raised border may leave an undesirable residue on the plate, which must then be removed.

One current process used to prevent edge curing is described in U.S. Pat. No. 6,326,124 to Alince et al., the subject matter of which is herein incorporated by reference in its entirety. Alince et al. discloses an edge-covering material containing at least one soluble, film-forming polymer, at least one UV absorber, and a solvent or solvent mixture that is applied on the edges of a photocurable printing plate before imagewise exposure of the printing plate to prevent unwanted ridges that result from exposure of printing plate edges. The edge-covering material is applied by brushing or spraying, preferably with a fine nozzle. However, this method is labor intensive and can be imprecise as the edge-covering material is manually applied to the cut edges.

There remains a need in the art for improved methods of treating cut surfaces (i.e., edges and corners) of printing plates to prevent the formation of unwanted ridges on the edges of the plate that can be performed more quickly and accurately than processes described in the prior art.

The inventors have surprisingly discovered that edge curing can be substantially eliminated by removing a portion of the coversheet on a periphery of the cut edges of the printing plate while leaving intact the layer of photocurable material and the ablation layer beneath the coversheet and subsequently applying an edge cure prevention composition to the layer revealed by the removal of the coversheet. This process allows for the cut surfaces of the plate to be quickly and accurately coated with the edge cure prevention composition.

The improved process of the invention is automated and is thus faster, more precise, and more effective than comparable manual processes of the prior art.

SUMMARY OF THE INVENTION

It is an object of the present invention to provide an automated method of applying an edge cure prevention composition to cut edges of a photosensitive printing element.

To that end, the present invention is directed to an improved method of applying an edge cure prevention composition that removes a periphery edge of the coversheet of the printing element and applies an edge cure prevention composition to the underlying layer revealed by the removal of the portion of the coversheet.

In one embodiment, the present invention is directed to a method of applying an edge cure prevention composition to cut edges of a photosensitive printing element comprising the steps of:
  a) cutting the photopolymer printing plate in a pattern of a desired size and shape for mounting on a sleeve or cylindrical carrier;
  b) removing a portion of the coversheet on a periphery of the cut edges of the printing plate while leaving intact the layer of photocurable material and the optional ablation layer beneath the coversheet;
  c) applying an edge cure prevention composition to the optional ablation layer or the layer of photocurable material revealed by the removal of the portion of the coversheet;
  d) drying the edge cure prevention composition; and
  e) removing the remainder of the coversheet from the photosensitive printing element.

The printing plate may then be processed in the usual manner.

DETAILED DESCRIPTION OF THE PREFERRED EMBODIMENTS OF THE INVENTION

The novel process of the invention prevents, or substantially eliminates, premature curing of cut surfaces of a photosensitive printing plate. The photosensitive printing element generally comprises a support layer, one or more layers of a photocurable material deposited on the support layer, optionally, but preferably, at least one ablation layer deposited on the one or more layers of photocurable material that is ablatable by a laser at a selected wavelength and power, and comprises a radiation absorbing material that is sensitive to radiation at the selected wavelength and power of the laser, and a coversheet.

The improved method of the invention generally comprises the steps of:
  1. Cutting the photopolymer printing plate in a pattern of a desired size and shape for mounting on a sleeve or cylindrical carrier.
  2. Removing a portion of the coversheet on a periphery of the cut edges of the printing plate while leaving intact the layer of photocurable material and the optional ablation layer beneath the coversheet.
  3. Applying an edge cure prevention composition to the optional ablation layer or the layer of photocurable material revealed by the removal of the portion of the coversheet.
  4. Drying the edge cure prevention composition.
  5. Removing the remainder of the coversheet from the photosensitive printing element.

Once the edge cure prevention composition has been applied to the surfaces of the printing plate and the printing plate has been cut into a pattern of the desired size and shape, the photosensitive printing plate may be mounted on a sleeve or cylindrical carrier and processed in the usual manner. The improved method of the invention ensures that the edge cure prevention composition is only applied to the areas where it is needed and will not affect the imageable areas of the plate, which remain covered until after the edge cure prevention fluid has been applied.

The edge cure prevention composition is a material that is substantially opaque to actinic radiation in at least one wavelength region, which is effective to cure the photocurable material in the printing element, and is used to substantially limit unwanted exposure of the photocurable material to actinic radiation. Various edge cure prevention compositions are usable in the practice of the invention, including liquid carbon dispersions, UV opaque inks, and other materials that are substantially opaque to actinic radiation in at least one wavelength region effective to cure photocurable material in the printing plate. Polymer solutions such as those described in U.S. Pat. No. 6,326,124 to Alince et al., the subject matter of which is herein incorporated by reference in its entirety, are also usable in the practice of the invention.

The UV-opaque inks that are usable in the instant invention include any liquid or solid moiety that is both substantially opaque to actinic radiation in at least one wavelength region effective to cure the above-described photocurable elements and substantially resistant to polymerization upon exposure to actinic radiation in that wavelength region. Substantially opaque inks are those that can absorb at least about 85% of any incident actinic radiation, preferably about 90% of such radiation, more preferably about 95%, and even more preferably 99.9% of such radiation. Preferred inks include one or more radiation-absorptive molecules dissolved in solvent. Particularly preferred inks are the U-26, U-53M, Black 4D, and Jolt brands (Dataproducts Corporation) and those formed by mixing Crown Super Marking Stamping Ink (Fulton Marking Equipment Company, Warminster, Pa.) and UVINUL 3050 brand 2,2',4,4'-tetrahydroxybenzophenone (BASF, Ludwigshaven, Germany) in a solvent selected from methanol, isopropanol, n-butanol, chloroform, methyl ethyl ketone, propylene glycol monomethyl ether, dipropylene glycol monomethyl ether, diethylene glycol ethyl ether, and mixtures thereof. Other useful ink ingredients include the Tinopal SPF and Joncryl-68 products, which are commercially available from Ciba-Geigy Corp., Hawthorn, N.Y., and S.C. Johnson Company, Milwaukee, Wis., respectively.

The edge cure prevention composition can be applied by any means known in the art for applying such compositions, but is preferably applied by spraying, dispensing or brushing the composition onto the photosensitive printing plate. The edge cure prevention composition is applied to effectively cover the areas on the top of the plate revealed by the removal of the coversheet as well as the cut side edges of the printing plate. The consistency of the edge cure prevention composition may be adjusted as necessary, depending on the application means used.

Computer controlled cutting-tables are often used in plate making processes for the intricate cutting that is necessary to prepare photopolymer plates for mounting on sleeves and cylindrical carriers and to precisely and reproducibly cut flat photopolymer sheets into a desired shape. The cutting blade is generally controlled by a microprocessor so that the printing element may be precisely cut into the desired shape and size for mounting on the printing cylinder. Once the plate is cut to the desired size and shape, the software used to control the cutting blade to cut the printing element into the desired shape adjusts the depth of the cutting blade so that it pierces only the coversheet and traces the path used for cutting the printing element to precisely remove the desired portion of coversheet on the periphery of the cut edges of the plate.

In a preferred embodiment of the invention, less than about 1/16-inch of the coversheet is removed on the periphery of the cut edges of the printing plate. More preferably, less than about 1/32-inch of the coversheet is removed on the periphery of the cut edges of the printing plate.

After the coversheet is removed around the periphery of the cut edges of the printing plate, the edge cure prevention composition is applied to the area revealed by the removal of the portion of the coversheet. The photosensitive printing plate may then be mounted on a sleeve or cylindrical carrier and subjected to further processing.

Preferably, the printing element is subjected to the following process steps:

1) selectively ablating the at least one ablation layer with the laser to provide ablated and nonablated areas forming an image;

2) flood exposing the laser imaged printing plate to UV light without a negative, thereby curing the one or more photocurable layers in areas under ablated areas of the ablation layer; and 3) treating the flood exposed laser imaged printing plate with at least one developer solution to remove the at least one ablation layer that was not removed during the laser ablation step and the areas of the one or more photocurable layers that were not exposed to actinic radiation. Alternately, instead of a developer solution, a heated blotting material may be used to soften and remove non-crosslinked photocurable material on the imaged surface of the printing plate.

The novel process of the invention substantially eliminates edge curing of the cut edges of the printing plate. The edge cure prevention composition can be quickly and accurately applied where it is needed, without any damage to the imageable areas of the printing plate.

What is claimed is:
1. A method of preventing premature curing of cut surfaces of a photosensitive printing plate, the method comprising the steps of:
   a) providing a photosensitive printing plate comprising:
      i) a support layer;
      ii) at least one layer of photocurable material on the support layer;
      iii) optionally, at least one ablation layer deposited on the one or more layers of photocurable material, wherein the at least one ablation layer is ablatable by a laser at a selected wavelength and power, and wherein the ablation layer comprises a radiation absorbing material that is sensitive to radiation at the selected wavelength and power of the laser; and
      iv) a coversheet;
   b) cutting the photosensitive printing plate in a pattern of a desired size and shape;
   c) removing a portion of the coversheet on a periphery of the cut edges of the printing plate while leaving intact the layer of photocurable material and the optional ablation layer beneath the coversheet;
   d) applying an edge cure prevention composition to the optional ablation layer or the layer of photocurable material revealed by the removal of the portion of the coversheet; and
   e) removing the remainder of the coversheet from the photosensitive printing element.

2. The method according to claim 1, further comprising a step of mounting the photosensitive printing plate on a sleeve or cylindrical carrier after the photosensitive printing plate has been cut to the pattern of the desired size and shape and the edge cure prevention composition has been applied.

3. The method according to claim 1, wherein the printing plate is cut into a pattern of the desired size and shape by a cutting blade that is controlled by a microprocessor.

4. The method according to claim 3, wherein the portion of the coversheet is removed by adjusting a depth of the cutting blade so that the cutting blade pierces only the coversheet and the microprocessor retraces the cutting pattern used to cut the printing plate into the desired size and shape to direct the cutting blade to remove the portion of the coversheet on the periphery of the cut edges of the printing plate.

5. The method according to claim 1, wherein the edge cure prevention composition is selected from the group consisting of liquid carbon dispersions, UV-opaque inks, and other materials that are substantially opaque to actinic radiation in at least one wavelength region effective to cure the photocurable material in the photosensitive printing plate.

6. The method according to claim 1, wherein the edge cure prevention composition that is applied to the optional ablation layer or the layer of photocurable material is dried prior to step e).

7. The method according to claim 1, wherein the at least one ablation layer is present and the method further comprises the steps of:
   selectively ablating the at least one ablation layer with the laser to provide ablated and nonablated areas forming an image;
   flood exposing the laser imaged printing plate to UV light without a negative, thereby curing the one or more photocurable layers in areas under ablated areas of the ablation layer; and treating the flood exposed laser imaged printing plate with at least one developer solution to remove the at least one ablation layer that was not removed during the laser ablation step and the areas of the one or more photocurable layers that were not exposed to actinic radiation.

8. The method according to claim 1, wherein the edge cure prevention composition is applied by spraying, dispensing or brushing the composition onto the photosensitive printing plate.

9. The method according to claim 1, wherein the edge cure prevention composition is applied to cover the cut side edges of the printing plate.

10. The method according to claim 1, wherein less than about 1/16-inch of the coversheet is removed on the periphery of the cut edges of the printing plate.

11. The method according to claim 10, wherein less than about 1/32-inch of the coversheet is removed on the periphery of the cut edges of the printing plate.

* * * * *